March 19, 1968 SEIICHI TABUCHI ET AL 3,374,400

COMPOUND ELECTRONIC UNIT

Filed Sept. 1, 1965

INVENTORS
SEIICHI TABUCHI
HIROYUKI MATSUZAKI
TATUO TSUBOI
BY KARL RATH
ATTORNEY

1

2

3,374,400

COMPOUND ELECTRONIC UNIT

Seiichi Tabuchi, Hiroyuki Matsuzaki and Tatuo Tsuboi, Kawasaki-shi, Japan, assignors to Fujitsu Limited, Kawasaki-shi, Japan Filed Sept. 1, 1965, Ser. No. 484,260
Claims priority, application Japan, Sept. 2, 1964, 39/50,143
6 Claims. (Cl. 317—101)

ABSTRACT OF THE DISCLOSURE

In a hybrid integrated electronic circuit, complete separation is achieved between the active and passive circuit elements by the use of a pair of planar insulating members forming the parts of a two-part housing, said members being hermetically connected with one another along registering wall-like mating surfaces thereof. The at least partly interconnected active circuit elements of the unit are supported by one of said members and the at least partly interconnected passive circuit elements of said unit are supported by the other of said members, while the elements of one member are electrically connected with the elements of the other member via registering surface contact elements disposed upon said mating surfaces and being in intimate conductive contact with one another in the closed and sealed position of the housing. Terminal conductors also in contact with said elements pass through and project outwardly from the housing.

The invention relates to hybrid integrated electronic circuits or units.

With rapidly developing electronic computer and like techniques, various hybrid integrated electronic circuit units have been proposed in the past, in an effort to meet the demand for highly complicated logic circuits in compact form.

One of the conventional units of this type comprises a printed circuit board having mounted thereon a plurality of discrete active and passive circuit elements, such for instance as transistors, diodes, resistors, condensers, etc.

Another conventional unit known as "micromodule" comprises a block constituting a stack of insulating boards, for instance, of ceramic material, each of said boards supporting an electronic circuit formed thereon by coating, printing, evaporation, metallizing, etc. in a manner well known.

A still further known unit of this type comprises an insulating board consisting of ceramic material or the like and fitted, on the one hand, with resistive coatings formed thereon by a metallizing or the like process, to form one or more electronic circuits, and fitted, on the other hand, with solid elements such as transistors, diodes, or the like elements, preferably in the form of chips of well-known type.

Finally, fully integrated circuit units are known, wherein all the elements, such as transistors, diodes, resistors, etc. are formed or deposited upon a base of semi-conductor material.

With the first-mentioned type of unit or assembly, serious difficulties have been encountered in that a relative large mounting space is required which makes it necessary to miniaturize the assembly as far as possible. In addition, it has been found that the technique of manufacturing such units is both complicated as well as time consuming.

The second type of assembly unit mentioned is also rather voluminous depsite its miniaturized construction, since in this case one or more transistors, diodes, resistors, etc. must be rigidly fitted to a substrate or wafer and a plurality of such wafers stacked to form a rigid assembly or structure.

The third type of assembly unit mentioned has the drawback that the operation of the unit is not reliable and uniform and that the attachment of the elements frequently involves other well-known difficulties.

Finally, the fourth type of assembly unit mentioned has the drawback of a poor percentage output of commercially and technically satisfactory units obtainable from a production line or process.

It is therefore the object of the present invention to provide an improved compound miniature electronic circuit unit of the referred to type, more specifically a hybrid circuit unit, designed to overcome the difficulties and drawbacks inherent in the prior units and techniques and capable of ensuring a higher percentage output ratio of satisfactory units, or units complying with a desired tolerance range as to their final operating characteristics.

With the foregoing object in view, the compound electronic circuit unit according to the present invention comprises essentially two substrates or plate elements, one of said elements being fitted with one or more active circuit elements, such as transistors, diodes, etc., preferably in the form of chips, and the other plate element having mounted thereon one or more passive circuit elements, such as resistors, capacitors, etc., preferably in the form of thin film deposits, both said elements forming the parts of a two-part housing and being combined into a sealed unit by a soldering, fusing or the like connection, to provide a compact circuit unit.

In other words, according to the present invention, the plate element or housing part carrying all of the passive elements serves effectively as a covering member for the plate element or housing part carrying all of the active elements of the circuit, and vice versa, as will become more apparent as the description proceeds.

As is well known, the modes of producing and attaching the active and passive circuit elements are highly different from one another and, accordingly, the separate formation and attachment of etiher type of element, as provided by the present invention, is highly advantageous in the fabrication of hybrid circuits or units. For instance, the defective attachment of one type of element will not adversely affect the attachment of the circuit elements of the other type, in that the defecive sub-assembly may be discarded before completion of the final assembly or unit. Besides, it is well known to those skilled in the art that the adjustment of resistors, condensers, etc. as employed in the thin film technique is advantageously carried out while the elements are isolated from the semi-conductors with which they are to cooperate in the final circuit or unit. This later requirement is complied with by the invention most simply and efficiently.

Moreover, it has been found advantageous, from both a practical and manufacturing point of view, to complete a semi-conductor circuit while it is devoid of any thin film elements, such as resistors and capacitors. This aim is achieved by the present invention by the provision of a compound or integrated electronic circuit unit made of two initially separated and relatively easily constructed substrates or housing parts, individually supporting the active and passive circuit elements, respectively, and which are then fused or otherwise connected to form a final circuit unit.

The foregoing and further objects as well as novel features of the invention will more fully appear from the following detailed description taken in conjunction with the accompanying drawing which illustrates various practical embodiments for carrying into effect the invention, it being understood that the drawing is intended to serve for illustration only and not be regarded in a restrictive sense.

In the drawing, wherein like reference characters denote like parts in the several views thereof;

Figure 3:
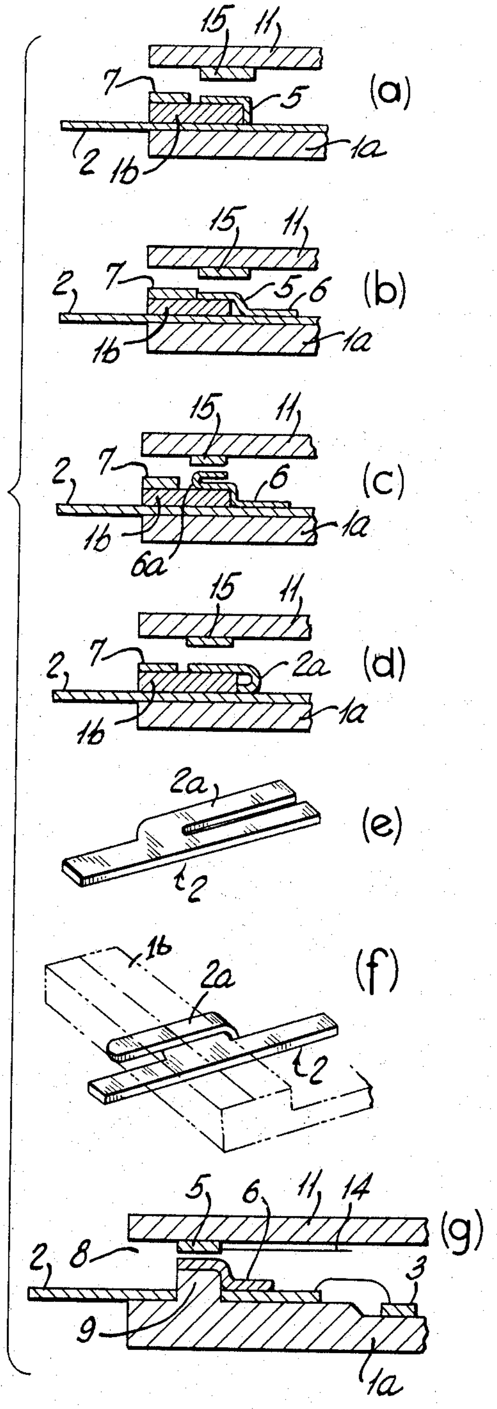
Figure 1:
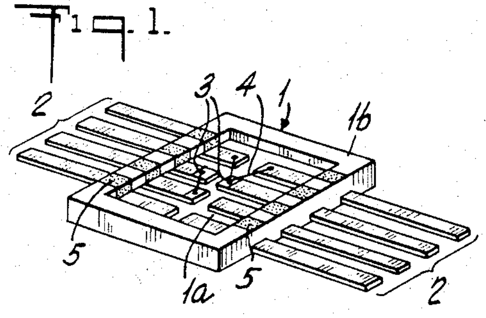
FIG. 1 is a perspective view of the lower plate element or housing part of a hybrid integrated electronic circuit unit, said element supporting a plurality of active circuit elements according to the invention.
Figure 2:
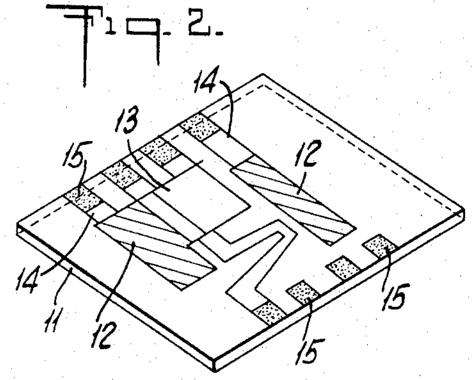
FIG. 2 is a perspective view of the upper plate element or housing part forming a cover for the part according to FIG. 1 and supporting a plurality of passive circuit elements in accordance with the invention.
Figure 4:
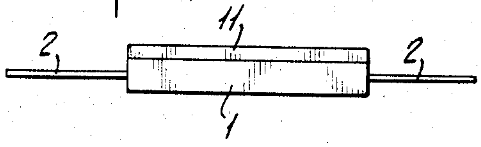

FIGS. 3(*a*) to 3(*g*) are fragmentary views illustrating various modes of joining or sealing the elements according to FIGS. 1 and 2; and FIG. 4 is a side elevation showing a completed unit according to the invention.

Referring to the drawing and more particularly to FIG. 1, the numeral 1 denotes a lower, according to the example shown, plate or housing part consisting of a rigid insulating material, such as ceramic, glass, etc. and comprising a preferably square base 1*a*, of say 6.2 mm. dimension and 1.4 mm. thickness, and a peripheral flange 1*b* integral with said base. There are further shown two groups of connecting leads denoted collectively by the numeral 2 and having the form of parallel metallic strips mounted in position during the manufacture of the element 1, for instance, during a molding or the like process. The arrangement is preferably such that the strips 2 pass from the outside through the marginal plane between the constituent parts 1*a* and 1*b* of the element into the interior space of the element forming a box-like part or housing. In other words the free end portions of the strips 2 extending inwardly of the flange 1*b* are in contact with the upper face of the base plate 1*a*, as shown in the drawing. The strips or leads 2 preferably consist of a high current conducting material, yet having a small enough coefficient of thermal expansion, a suitable material being an alloy of iron, nickel and cobalt, such as known under the tradename of "Coval" and supplied by Western Electric Corporation, or alternatively a material known under the tradename of "Fernico" may be utilized for the purpose of the invention.

Applied to the inner ends of selected strips 2, having advantageously a thickness of say 0.1 mm. and being separated from each other by distances of say 0.4 mm., are the active circuit elements 3, such as transistors, diodes, etc., preferably in the form of pellets, chips, or the like solid elements, being of specific but conventional design and fused or otherwise attached to said strips. Connecting leads 4 serve to connect the elements 3 with each other in accordance with the specific circuit involved. Conductive and fusible contact layers 5 are formed on the top face of flange 1*b*, to establish each a current-conducting path starting from the adjoining strip 2 and extending to the upper surface of the said flange. As will be described hereinafter, the upper flat or wall-like surface of the flange 1*b* is utilized both for the joining of the housing parts or elements 1 and 11, FIG. 2 as well as for effecting electrical connection between the active and passive circuit elements, respectively, supported by said elements. The shape of the contact elements or layers 5 may be rectangular circular, elliptical, etc., instead of square, as shown by way of example in the drawing.

In FIG. 2 is shown the upper plate or housing part 11, the material of which may be the same as that employed for the lower plate or part 1. Plate 11 is constructed in planar form as shown and serves to support one or more passive circuit elements, such as resistors 12 and capacitors 13, preferably in the form of thin films or laminations deposited upon the surface and covering discrete limited areas of said plate.

The formation of the passive circuit elements 12 and 13 may be carried out in a conventional manner by the use of a printing, coating, evaporation, etc. technique. Several conducting paths or leads, as indicated by reference numeral 14 serve to electrically interconnect selected elements both with each other and with marginal conducting layers 15 having areas corresponding to those of the layers 5 on the plate or part 1, FIG. 1, to establish electrical contact connection between the active and passive circuit elements in the closed or sealed condition of the housing parts 1 and 11, as will appear from the following.

Various modes of joining the lower and upper housing parts 1 and 11 are shown, by way of example, in FIGS. 3(*a*) to 3(*g*).

Referring to FIG. 3(*a*), the upper part 11 is shown upside down, in respect to the position according to FIG. 2, in such a manner that each conducting layer 15 is in registry with the corresponding layer 5 on the part 1. The layers 5 and 15 may consist of an alloy having a low melting point, commonly known as fusing metal in the art. Preferably, a fusing strip or layer 7 is employed for uniting the parts, said strip being composed, for instance, of glass of low melting point. By the provision of the layers 5, 7 and 15, in the manner shown, the housing parts 1 and 11 may be intimately united by heating, to result both in a physical as well as electrical connection of the parts or circuit elements, respectively.

According to FIG. 3(*b*), the arrangement for fusing the parts 1 and 11 is substantially the same as before. In this case, however, connecting metal strips 6 are employed in place of the layers 5 and fused or welded to selected ones of the leads or strips 2. Both elements 1 and 11 are again fused together at the separate zones or areas 5 and 15 through the intermediary of the strip 7. In practice, the number of additional strips 6 may be as high as the number of connecting areas 5 and 15 of the parts to be joined.

In the modified arrangement shown by FIG. 3(*c*), one of the additional strips 6 is turned back upon itself, as at 6*a*, to provide a springy part or contact in place of a layer 5.

According to a still further modification as shown in FIG. 3(*d*), each of the leads 2 has a cut-out and turned back portion 2*a*, to replace the contacts 5 and to form a springy and easily fusible connection with the layers 15.

In the views according to FIGS. 3(*e*) and 3(*f*), a preferred configuration of the leads 2 is shown before and after turning back of part 2*a* according to FIG. 3(*d*).

Finally, in FIG. 3(*g*), the flange 1*b* according to the preceding figures is displaced inwardly of the edge of plate 1*a* by a small distance, to provide a square ridge 9 projecting from said plate. A number of connecting strips 6, being substantially the same as before, may be employed for the unit of this construction for the connection of the circuit elements on both plates 1 and 11. The outer peripheral configuration of the part or plate 11 in this case corresponds to the modified part or plate element 1. The closed frame-like ridge 9 provides an outer open space 8 between the parts suitable for receiving a fusing agent or material.

During assembly of the unit, both parts or elements 1 and 11 are brought into registry with one another, in such a manner that each of the conducting and easily fusible layers or contacts 5, preferably consisting of ordinary soldering material, is brought into contact with the corresponding layer or contact 15 or connecting strip 2*a* and 6*a*, respectively, and the device then sealed in a heating furnace by the strip of sealing material 7, to result in a final compact unit as shown in FIG. 4. Although the ridge 9 has been described as being integral with the plate element 1*a*, it may be separate and affixed thereto in any suitable manner.

What is claimed is:

1. A hybrid microelectronic circuit unit comprising in combination:

(1) a first planar insulating member having a cavity surrounded by an outer rim, (2) a plurality of juxtaposed and spaced conductive terminal strips having inner portions overlying the bottom of said cavity and outer portions sealed in said rim and projecting outwardly from said member, (3) a plurality of at least partly interconnected and discrete active electronic circuit components each supported by and in electrical contact connection with the inner portion of one of said strips, (4) a second planar insulating member having a contour conforming with the outer contour of said rim, to form a cover for said first member, (5) a plurality of at least partly interconnected passive electronic circuit components supported by said second member, (6) a series of first conductive contact elements upon the edge surface of said rim with means to electrically connect the same with one of said strips, (7) a cooperating series of conductive contact elements upon the edge zone of said second member with means to electrically connect the same with at least one of said passive circuit components, (8) said contact elements designed and mutually spaced, whereby to cause coordinated elements of both said series to register in mutual contact connection with one another upon mounting of said second member upon said first member, and (9) means to bond said second member to said first member, to hermetically seal the components enclosed thereby.

2. In a microelectronic circuit unit as claimed in claim 1, wherein said contact elements are applied to a strip-like zone inwardly, respectively, of the outer contour of said rim and of said second member, and wherein said last means consists of a strip of bonding material adjoining said outer contours of and hermetically connecting said members.

3. In a microelectronic circuit unit as claimed in claim 2, wherein said strip of bonding material consists of glass.

4. In a microelectronic circuit unit as claimed in claim 2, wherein said contact elements consist of layers of easily fusible metal.

5. A hybrid microelectronic circuit unit comprising in combination:

(1) a planar two-part insulating housing composed of first and second halves hermetically bonded to one another along registering wall like mating surfaces thereof, (2) a plurality of at least partly interconnected discrete active electronic circuit components supported by the first half of said housing within said wall-like surfaces, said components constituting the sole active elements of said circuit, (3) a plurality of at least partly interconnected passive electronic circuit components supported by the second half of said housing within said wall-like surfaces, said components constituting the sole passive elements of said circuit, (4) a plurality of registering and electrically connected spaced surface contact elements upon said mating surfaces of said members with means to electrically connect the same, respectively, with at least part of the active and passive components of the associated housing halves, to interconnect said active and passive components in the closed position of said housing halves, and (5) a plurality of terminal conductors each in contact with one of said elements and passed through and projecting from the outside of said housing.

6. In a microelectronic circuit as claimed in claim 5, said contact elements consisting of fusible metallized coatings upon said mating surfaces.

References Cited

UNITED STATES PATENTS

| | | |
|---|---|---|
| 3,292,241 | 12/1966 | Carroll. |
| 3,105,868 | 10/1963 | Feigin et al. |
| 3,239,719 | 3/1966 | Shower. |
| 3,265,806 | 7/1966 | Burks et al. |

FOREIGN PATENTS

| | | |
|---|---|---|
| 1,284,551 | 1/1962 | France. |

ROBERT K. SCHAEFER, *Primary Examiner.*

D. SMITH, *Assistant Examiner.*